United States Patent
Nakagawa et al.

(10) Patent No.: US 6,888,399 B2
(45) Date of Patent: May 3, 2005

(54) SEMICONDUCTOR DEVICE EQUIPPED WITH A VOLTAGE STEP-UP CIRCUIT

(75) Inventors: Michio Nakagawa, Kyoto (JP); Kazuo Sato, Kyoto (JP); Hiromi Uenoyama, Kyoto (JP); Yasuyuki Ohnishi, Kyoto (JP); Kazunori Torii, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/358,491

(22) Filed: Feb. 4, 2003

(65) Prior Publication Data

US 2003/0151449 A1 Aug. 14, 2003

(30) Foreign Application Priority Data

| Feb. 8, 2002 | (JP) | 2002-031944 |
| Feb. 20, 2002 | (JP) | 2002-042986 |
| Apr. 2, 2002 | (JP) | 2002-099480 |

(51) Int. Cl.[7] ............... G05F 1/10; G05F 3/02
(52) U.S. Cl. ............................................ 327/536
(58) Field of Search ....................... 327/536, 537, 327/589, 299; 363/59–60

(56) References Cited

U.S. PATENT DOCUMENTS

| 5,999,425 A | * | 12/1999 | Lacey et al. | 363/60 |
| 6,100,577 A | * | 8/2000 | Hung et al. | 257/299 |
| 6,121,821 A | * | 9/2000 | Miki | 327/536 |
| 6,448,842 B2 | * | 9/2002 | Zanuccoli et al. | 327/536 |
| 6,501,325 B1 | * | 12/2002 | Meng | 327/536 |

FOREIGN PATENT DOCUMENTS

| JP | 05-300727 | 11/1993 | H02M/3/07 |
| JP | 2000-069745 | 3/2000 | H02M/3/07 |
| JP | 2000-133722 | 4/2000 | H01L/21/8238 |
| JP | 2001-229697 | 8/2001 | G11C/29/00 |
| JP | 2001-292564 | 10/2001 | H02M/3/07 |
| JP | 2003-197790 | 7/2003 | H01L/21/8249 |

* cited by examiner

*Primary Examiner*—Quan Tra
(74) *Attorney, Agent, or Firm*—Hogan & Hartson LLP

(57) ABSTRACT

A semiconductor device is equipped with a step-up circuit having a series of multiple charge pump units. Each of the units has a well separation type MOS transistor. The separation well of the transistor is coupled to a high potential so as to form double reverse biases between the N-type well and a P-type substrate and between the N-type well and a P-type well. This permits the threshold Vth of the MOS transistor to be held at low level. The units are provided with a clock whose current supply capability is limited until a predetermined condition (that a predetermined period of time has elapsed after the onset of the step-up circuit by a startup signal or that the output voltage has reached a predetermined level). This limitation of the clock facilitates suppression of power consumption by the step-up circuit during a startup, thereby reducing changes in amplitude of a supply voltage.

2 Claims, 14 Drawing Sheets

SEMICONDUCTOR DEVICE EQUIPPED WITH A VOLTAGE STEP-UP CIRCUIT

FIELD OF THE INVENTION

The invention relates to a semiconductor device equipped with a voltage step-up circuit for stepping up a low supply voltage to higher voltages.

BACKGROUND OF THE INVENTION

Step-up circuits have been widely used in conventional semiconductor devices (referred to as ICs) such as EEPROM or flash memories in order to provide them with suitable power from a standardized single power source within the IC.

FIG. 1 is a schematic diagram of a conventional step-up circuit. The step-up circuit of FIG. 1 has a series of N-stage charge pump units U1–Un (referred to as units), with U1 being the first stage receiving a supply voltage and Un being the final output unit. The unit U1 of the first stage is supplied with a supply voltage Vcc (which is for example 2 V or 3 V) via a diode-connected N-type MOS (referred to as NMOS) transistor Q0. The output voltage of the unit Un is stored in a capacitor Co connected to the unit Un. This voltage (typically 10 V) is the output voltage Vout of the circuit.

Each of the units U1–Un has a similar structure, and only the unit U1 will be discussed. The unit U1 includes an NMOS transistor Q1 and a capacitor C1. The source S of the NMOS transistor Q1 is connected to the gate G thereof, thereby forming a so-called diode connection. The source S is also connected to the supply voltage Vcc via the NMOS transistor Q0. The drain D of the NMOS transistor Q1 is connected to the unit U2 of the next stage.

The capacitor C1 has one end connected to the source S of the NMOS transistor Q1 and the other end connected to a clock line of a first clock CLK1. The capacitors of odd numbered units U1, U3, . . . are connected to the clock line of the first clock CLK1, while the capacitors of even numbered units U2, U4, . . . are connected to a clock line of a second clock CLK2.

The clocks CLK1 and CLK2 constitute a two-phase clock having two opposite phases. The two phases have the same voltage amplitude which equals to, for example, the supply voltage Vcc.

In the step-up circuit shown in FIG. 1, when clocked by the clocks CLK1 and CLK2, capacitors of the respective units are charged up in turn to the supply voltage Vcc, creating the step-up voltage Vout. The resultant output voltage Vout may be supplied to an EEPROM for example.

The drain D and source S of the NMOS transistor of each unit are formed on a P-type substrate, which is grounded. The gate G of the NMOS is directly connected to the source S. In actuality, however, a threshold voltage Vth exists between the gate G and the drain D, so that the drain potential of respective units is lower than that of the source S by the threshold voltage Vth. That is, the voltage stepped up by respective units will be at most [Vcc-Vth].

It is noted that the threshold voltage Vth of respective NMOS transistors increases with the potential difference between the source and the substrate potentials (the substrate normally grounded) due to the substrate bias effect. Consequently, a step-up voltage of a unit decreases from the first to the final stages.

For this reason, in order to obtain an appreciably high output voltage from a given supply voltage Vcc, it is necessary to implement many charge pump units connected in series. If the threshold voltage Vth is higher than the supply voltage Vcc, stepping up of voltage itself is not possible.

This problem is serious especially when the supply voltage Vcc is low. Therefore, there is a need to solve this problem for modern IC devices designed to be operable at a greatly reduced supply voltage.

A further problem pertinent to a step-up circuit concerns minimization of the circuit. Normally, the insulation layer serving as a dielectric of the capacitor used in a charge pump circuit is relatively thick to withstand a required stepped up voltage. However, since the capacitance of the capacitor decreases with the thickness of the insulation layer, the capacitor requires a larger area.

In order to reduce the areas of capacitors, thereby reducing the areas of the charge pump circuits, Japanese Patent Application Laid Open H5-28786 proposes an arrangement in which the insulation layers of low-voltage capacitors near the input end of the charge pump circuit have a reduced thickness while those of the capacitors near the terminal end of the charge pump circuit have an increased thickness to withstand a high stepped up voltage.

In this step-up circuit, however, the insulation layers are relatively thick near the terminal end of the circuit, which prevents reduction of the capacitor area, and in some cases could result in an increase of the capacitor area on a chip.

In addition, in the step-up circuit as shown in FIG. 1, capacitors C1–Cn of the respective units U1–Un have a relatively large capacitance so as to be able to provide a large current along with a required output voltage Vout. Thus, during a startup when all the units U1–Un begin to operate at substantially the same time, drawing a large current from the voltage supply, they cause a large voltage drop and instability in the supply voltage. This instability takes place every time the step-up circuit is started up and can cause errors in the operations (e.g. write and read) of a logic circuit, for example, of a semiconductor device equipped with a step-up circuit.

It is possible to avoid such instability by proving the power supply with a sufficiently large power to cope with a large current requirement at all times. However, it is impractical to do so with, for example, light-weight and/or miniaturized semiconductor devices for use in portable apparatuses.

SUMMARY OF THE INVENTION

It is, therefore, an object of the invention to provide a semiconductor device equipped with a step-up circuit having a minimum number of charge pump units yet capable of providing a required high output voltage by totally or substantially removing the limitation by the threshold voltages of the MOS transistors used.

To attain the object above, the invention utilizes different capacitors in early stages and final stages of the multi-staged charge pump circuit. Thus, all the capacitors of the charge pump circuit of the semiconductor device occupy only reduced chip areas near not only the first stage but also the terminal stage of the charge pump circuit area.

The step-up circuit of the invention is adapted to change step-up conditions to minimize power consumption during a startup. Thus, the inventive semiconductor device equipped with such step-up circuit exhibits only a limited adverse effects caused by the voltage change on other circuits during a startup.

In accordance with one aspect of the invention, there is provided a semiconductor device equipped with a voltage step-up circuit, said voltage step-up circuit comprising multiple charge pump units connected in series, each charge pump unit consisting of a MOS transistor and a capacitor having one end connected to the input or output end of said MOS transistor and another end connected to a clock line supplying a clock, said multiple charge pump units adapted to step up a supply voltage in response to said clock, wherein said MOS transistor is a well separation type MOS transistor having
- a second-conduction type well formed in a first-conduction type substrate;
- a first-conduction type well formed in said second-conduction type well;
- a second-conduction type source region formed in said first-conduction type well;
- a second-conduction type drain region away from said source region and separated by a channel region; and
- a gate formed above, and separated by an insulation layer from, said channel region, and wherein said second-conduction type well is connected to a high potential so that opposite biases are established between said second-conduction type well and said first-conductive type substrate and between said second-conduction type well and said first-conduction type well.

It is noted that the NMOS transistor of each charge pump unit is a well separation type NMOS transistor, in which the N-type separation well is coupled with a high potential to establish a reverse bias between the N-type separation well and the P-type substrate and a further reverse bias between the N-type separation well and the P-type well. Because of this, in any of the series charge pump units, the potential of the P-type well can be equalized to the source potential.

Accordingly, the threshold voltage Vth of the MOS transistor of any charge pump unit is held to a constant low voltage, facilitating generation of a high output voltage by a fewer number of charge pump units. Since high step-up voltage per charge pump unit is attained in the units, drivability of the units by current can be enhanced. Step-up rate can be also enhanced.

In accordance with another aspect of the invention, there is provided a semiconductor device equipped with a voltage step-up circuit, said voltage step-up circuit comprising multiple charge pump units connected in series, each charge pump unit consisting of a MOS transistor and a capacitor having one end connected to the input or output end of said MOS transistor and another end connected to a clock line supplying a clock, said charge pump units adapted to step up a supply voltage in response to said clock, wherein the capacitor of at least the first unit of said multiple charge pump units receiving said supply voltage is a MOS capacitor;

the capacitor of at least the last unit of said multiple charge pump units providing the output voltage is a floating type capacitor that includes a first-conduction type layer formed on a semiconductor substrate (or in a well formed in said substrate); a dielectric layer formed on said first-conduction type layer; and a second-conduction type layer formed on said dielectric layer.

It is noted that the capacitor of at least the first charge pump unit, operating at a low voltage, of the multiple charge pump units is a MOS capacitor, and the capacitor of at least the final charge unit, operating at a high voltage, has a dielectric layer of large dielectric constant. Thus, the chip areas occupied by the capacitors of at least the first and final units of the charge pump circuit can be less than conventional capacitors, thereby reducing the overall chip area of the charge pump circuit.

In accordance with still another aspect of the invention, there is provided a semiconductor device equipped with a step-up circuit, said voltage step-up circuit comprising:

multiple charge pump units connected in series, each unit including a MOS transistor and a capacitor having one end connected to the input or output end of said MOS transistor and another end connected to a clock line supplying a clock, said charge pump circuit adapted to step up a supply voltage in response to said clock; and a clock generation circuit for generating said clock in response to a startup signal, wherein said clock generation circuit generates and provides to said capacitors a clock having a limited current supply capability (said clock referred to as limited current supply clock) until a predetermined condition is satisfied after the reception of said startup signal.

It is noted that until certain predetermined conditions (e.g. a predetermined time has elapsed after the startup and/or the output voltage has reached a predetermined level) are satisfied after the reception of a startup signal, the current supplied to each of the charge pump units by the clock is limited. Accordingly, energy consumption during a startup of the step-up circuit may be suppressed, thereby minimizing voltage variations that can adversely affect other circuits.

DETAILED DESCRIPTION OF THE PREFERRED EMBODIMENT

The invention will now be described in detail by way of examples with reference to FIGS. 2–5.

Figure 2:
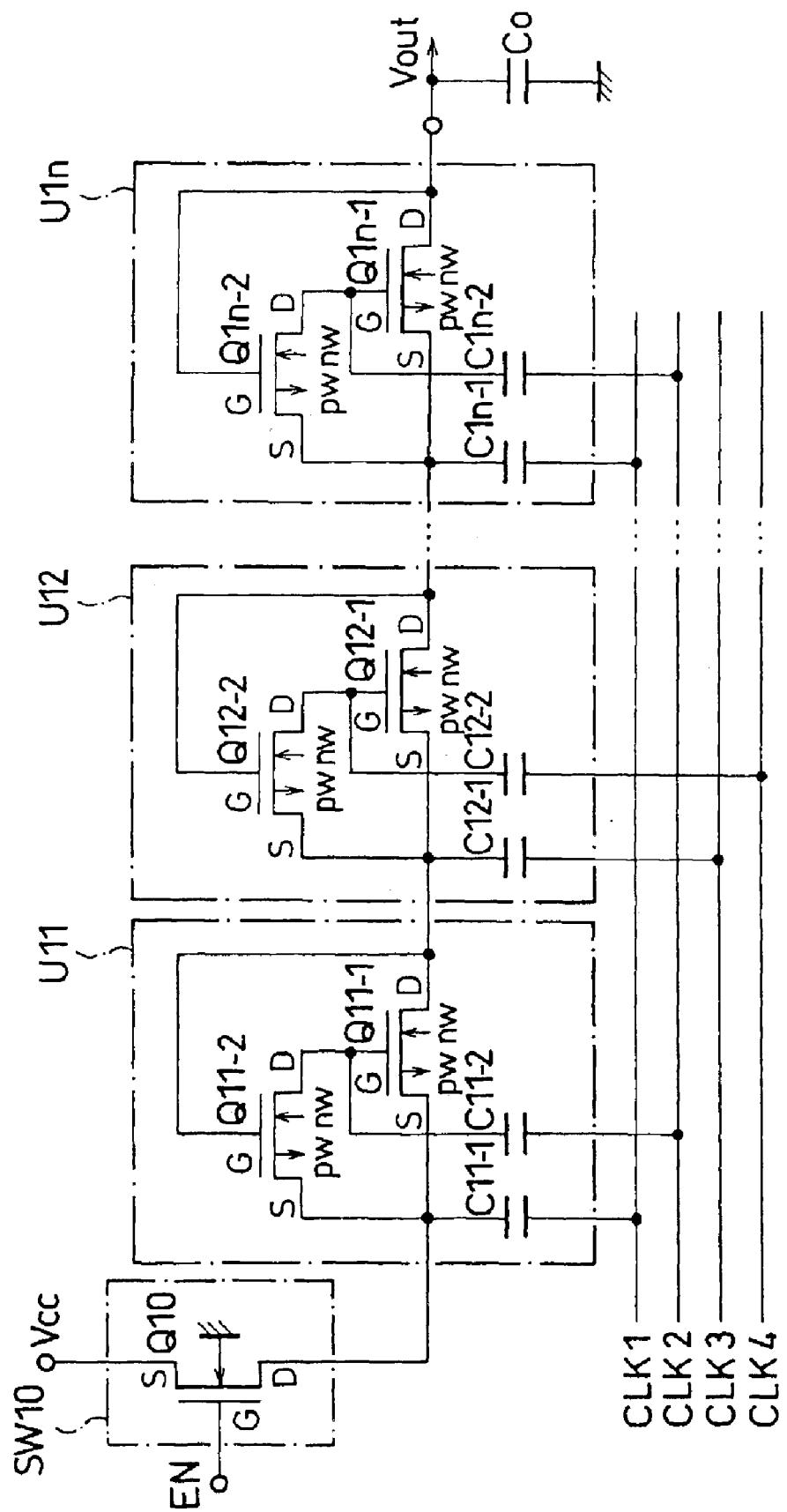
FIG. 2 is a circuit diagram of a first embodiment of a step-up circuit utilizing well separation type NMOS transistors, driven by a four-phase clock.
Figure 3:
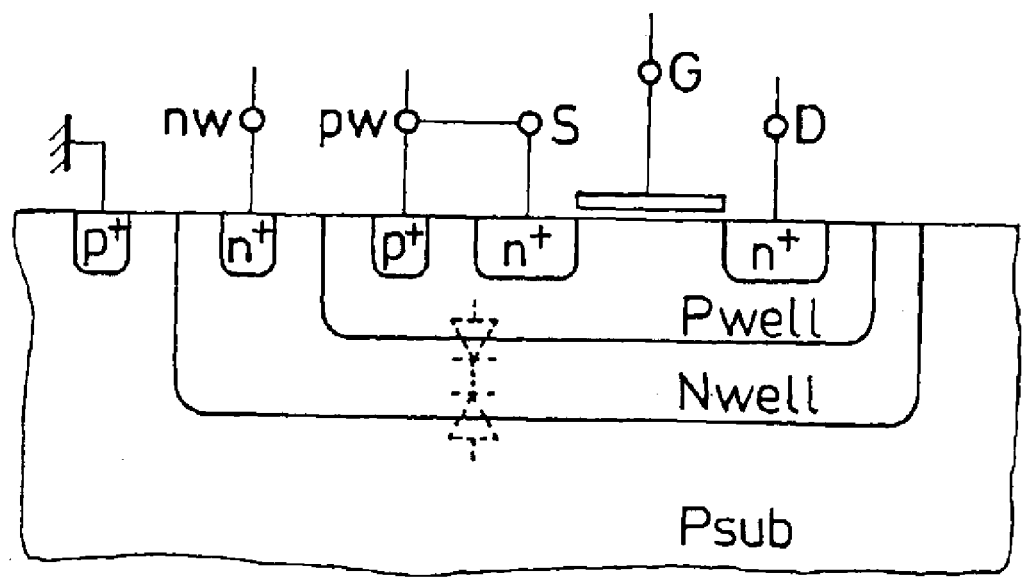
FIG. 3 is a cross sectional view of a well separation type NMOS transistor.
Figure 4:
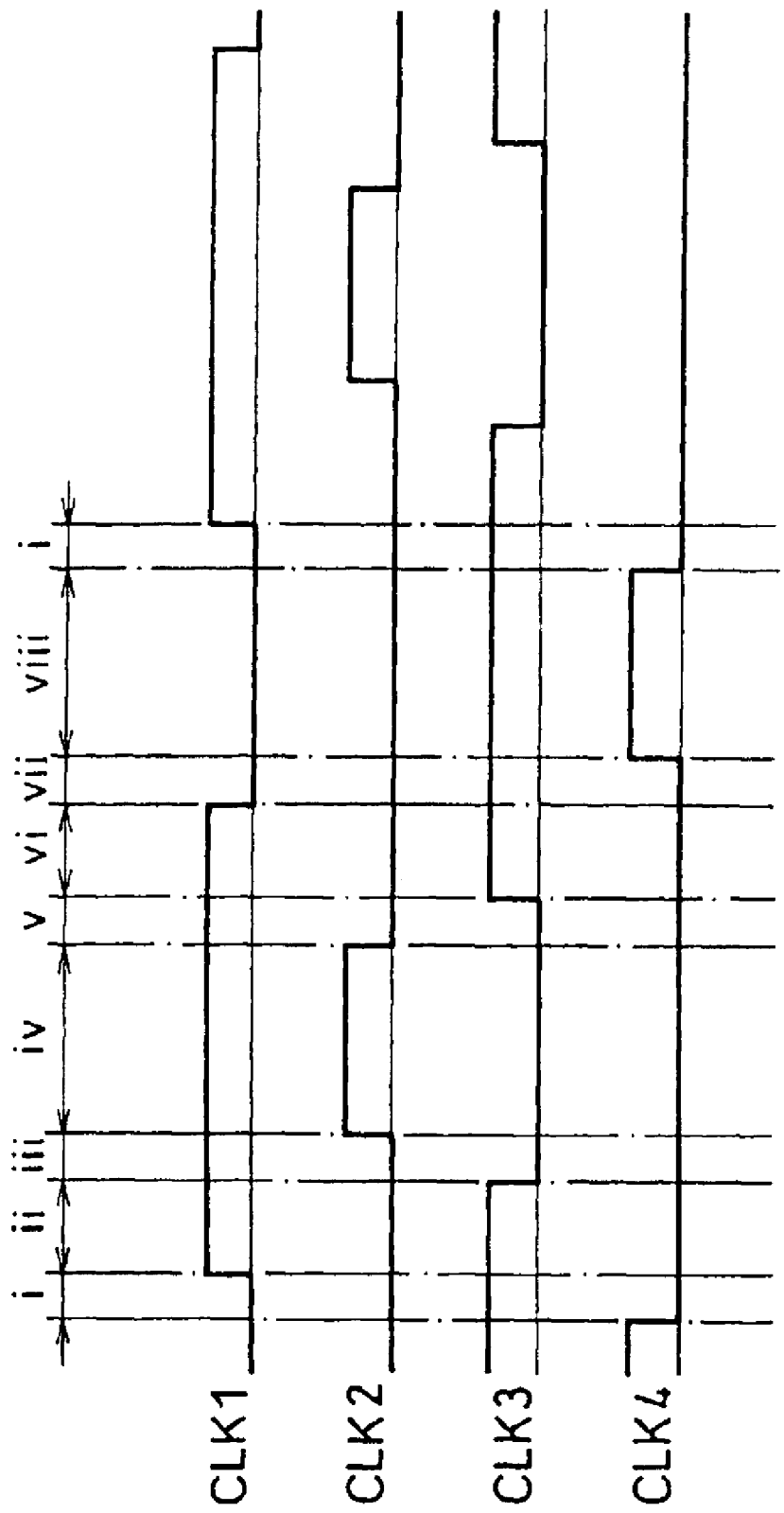
FIG. 4 is a timing diagram of a four-phase clock.

Referring now to FIG. 2, there is shown a step-up circuit utilizing well separation type NMOS transistors and driven by a four-phase clock for use in a first embodiment of the invention. FIG. 3 shows a cross section of the well separation type MOS transistor. FIG. 4 is a timing diagram of the four-phase clock.

As shown in FIG. 2, N-stage charge pump units U11–U1n are connected in series. Each charge pump units will be hereinafter often referred to as unit.

The first stage unit U11 is supplied with a supply voltage Vcc via a power switch SW10. The supply voltage is typically 2 or 3 Volts. The switch SW10 may be any ordinary NMOS transistor. This NMOS transistor Q10 is turned ON by an enable signal EN applied to the gate thereof to enable the step-up circuit. The enable signal EN has a voltage of Vcc. The NMOS transistor Q10 serves as a switch SW10. It works as a diode when it is turned ON. When it is turned OFF, it completely shuts off a current from the power supply to the charge pump circuit.

The voltage outputted from the unit U1n charges the output capacitor Co, which is outputted therefrom as a stepped-up voltage Vout. The stepped-up voltage is typically 10 Volts.

Since all of the units U11–U1n are identical in structure, only the first unit U11 will be described in detail below. The unit U11 has a well separation type main NMOS transistor Q11-1 and a main capacitor C11-1. The main NMOS transistor Q11-1 and the main capacitor C11-1 respectively correspond to the conventional NMOS transistor Q1 and capacitor C1 of FIG. 1.

In the first embodiment shown herein, a well separation type auxiliary NMOS transistor Q11-2 is connected between the gate G and the source S of the main well separation type NMOS transistor Q11-1. The gate of the NMOS transistor Q11-2 is connected to the drain D of the main NMOS transistor Q11-1. The gate G of the main NMOS transistor Q11-1 is connected to one end of an auxiliary capacitor C11-2. The auxiliary capacitor C11-2 can have a smaller capacitance than the main capacitor C11-1, since the former is provided to control the gate voltage of the latter. The other end of the main capacitor C11-1 is connected to a first clock line CLK1, while the other end of the auxiliary capacitor C11-2 is connected to a second clock line CLK2.

As is seen in FIG. 4, the first and the third clocks CLK1 and CLK3, respectively, have substantially opposite phases so that they are not simultaneously pulled to a low (LOW) level. Similarly, the second clock CLK2 and the fourth clock CLK4 are in substantially opposite phase so as not to be simultaneously pulled to a high (HIGH) level. The first clock CLK1 and the second clock CLK2 are used in odd numbered units U11, U13, etc, while the third and fourth clock CLK3 and CLK4, respectively, are used in even numbered units U12, U14, etc. Although the voltage of the H level of the clocks CLK1–CLK4 can be arbitrary, it is preferably the same as the supply voltage Vcc.

Referring to FIG. 3, there is shown a configuration of well separation type NMOS transistors Q11-1–Q1n-2.

To configure a well separation type NMOS transistor, an N-type well Nwell is formed in a P-type substrate Psub. A P-type well Pwell is formed in this N-type well Nwell. Formed in this P-type well Pwell are an n+ drain region and an n+ source region separated from the n+ drain region by a channel region. A gate G is provided above the channel region via an insulation layer. A contact is provided for each of the respective regions S, D, and G.

Also formed in the P-type substrate Psub is a p+ contact region, which is grounded. Formed in the N-type well Nwell is an n+ contact region, which is connected to an N-type well terminal nw. Formed in the P-type well is a p+ contact region, which is connected to a P-type well terminal pw. The P-type well terminal pw is also connected to the source S. The N-type well terminal nw is connected to, for example, the P-type well terminal pw having the high potential.

In each of the NMOS transistors Q11-1 Q1n-2, the N-type well Nwell thus formed is connected to the high potential to be doubly reverse-biased with respect to the P-type substrate Psub and to the P-type well Pwell. As a result, PN junction diodes formed as shown by phantom lines in FIG. 3 then become nonconductive, so that the P-type well is electrically insulated from the P-type substrate Psub. Incidentally, if the N-type well terminal nw is connected to the P-type well terminal pw, the N-type well Nwell will have the same potential as the P-type well Pwell.

In that case, the potential of the P-type well Pwell is determined by the potential of the source S, independently of the potential of the P-type substrate Psub. As a consequence, if the potential of the source S goes HIGH, the threshold voltage Vth due to substrate bias effect will not be affected at all by the source potential, and constantly remains LOW.

Referring to FIGS. 2–4, operations of the step-up circuit above will now be described.

As an enable signal EN is applied to the switch SW10, the NMOS transistor Q10 of the switch is turned ON, allowing to supply to the first stage unit U11 a voltage which equals the supply voltage Vcc lowered by the threshold voltage Vth of the NMOS transistor Q10. At the same time, a four-phase clock CLK1–CLK4 is supplied. That is, the step-up circuit is enabled.

Referring to a timing diagram of FIG. 4, there is shown step-up operations in the respective timing periods i–viii.

In period i, the first clock CLK1 has LOW level, and the main capacitor C11-1 is charged towards the input voltage.

In period ii, the first clock CLK1 has HIGH level. As a consequence, the source of the main NMOS transistor Q11-1 acquires a potential which equals the voltage of the main capacitor C11-1 plus the supply voltage Vcc (or HIGH), in accord with the law of conservation of charge. At this stage, the source potential is ideally 2Vcc-Vth. This source potential is higher than the supply potential Vcc. However, no reverse current will flow towards the voltage supply of Vcc due to the fact that the NMOS transistor Q10 is virtually diode-coupled.

The main capacitor C12-1 of the second stage unit U12 is charged by the charge of the main capacitor C11-1 via a parasitic diode formed between the P-type well Pwell and the drain D of the main NMOS transistor Q11-1. On the other hand, the NMOS transistor Q11-2 is turned ON by the potential of the main capacitor C11-1 applied to the gate G of the NMOS transistor Q11-2, which causes the auxiliary capacitor C11-2 to be charged and the gate G of the main NMOS transistor Q11-1 is impressed by the gate voltage, thereby turning ON the NMOS transistor Q11-1.

In the period iii, the third clock CLK3 goes LOW, so that the main capacitor C12-1 of the second stage unit U12 is further charged via a conducting NMOS transistor Q11-1.

In the period iv, the second clock CLK2 is pulled HIGH. As a result, the gate G of the main NMOS transistor Q11-1 acquires the potential of the auxiliary capacitor C11-2 superposed with the high voltage HIGH. This enhances conduction of the main NMOS transistor Q11-1, which in turn enhances charging of the main capacitor C12-1 of the next unit u12, facilitated by the threshold Vth of the main NMOS transistor Q11-1 being constant.

In the interval v, the second clock CLK2 returns to LOW, prevent the main capacitor C12-1 from reversely charging the main capacitor C12-1. In the interval vi, the third clock CLK3 resumes HIGH level, bringing the source of the second stage unit U12 to the voltage of the charged main capacitor C12-1 superposed by the voltage HIGH. At this moment the NMOS transistor Q12-2 has been turned ON. Consequently, the NMOS transistor Q12-1 will be turned ON, since the source potential is applied to the gate G of the NMOS transistor Q12-1 via the NMOS transistor Q12-2. Thus, the charge stored in the main capacitor C12-1 of the second stage unit U12 is supplied to the next unit U13 (not shown) via the NMOS transistor Q12-1.

Under this condition, the source potential of the NMOS transistor Q12-1, that is, the drain potential of the main NMOS transistor Q11-1, is higher than the source potential of the main NMOS transistor Q11-1. However, since the NMOS transistor Q11-1 is turned OFF, there will be no reverse current from the drain D to the source S of the main NMOS transistor Q11-1.

In the interval vii, the first clock CLK1 returns to LOW, but the capacitor C11-1 will not be reversely charged by the main capacitor of the next stage unit. In the interval viii, the fourth clock CLK4 goes HIGH, so that gate G of the NMOS transistor Q12-1 acquires a potential which equals the charged voltage of the auxiliary capacitor C12-2 plus HIGH voltage. This results in an increase in conductivity of the NMOS transistor Q12-1, which facilitates faster charging of the main capacitor C13-1 of the next unit U13 to a higher level, assisted by threshold voltage Vth of the NMOS transistor Q12-1 being constant.

The step-up operations involving the first and second units U11 and U12, respectively, during the intervals i–viii of the clock timing has described above. These operations will be successively performed by the clocks CLK1–CLK4 for the units U11–U1n The result is that the supply voltage of Vcc (2 V or 3 V) is stepped up to a prescribed output voltage Vout (e.g. 10 V).

In the first embodiment shown herein, well separation type NMOS transistors are used as main NMOS transistors Q11-1–Q1n-1, with a respective N-type well Nwell coupled with the HIGH potential (by connecting it to, for example, the P-type well terminal pw of the NMOS transistor). Accordingly, the threshold voltage of the main NMOS transistor of any unit in the step-up circuit is held LOW. Hence, the problem, pertinent to conventional step-up circuits, that the step-up voltage per unit decreases towards the output stage unit Un is solved by the invention. A supply voltage can be thus stepped up to a preferred output voltage by a minimum number of units.

The level of the gate voltages of the main NMOS transistors Q11-1–Q1n-1 can be raised using well separation type auxiliary NMOS transistors Q11-2–Q1n-2 and auxiliary capacitors C11-2–C1n-2 as a step-up unit coupled with a four-phase clock. The use of such well separation type auxiliary NMOS transistors in combination with the main NMOS transistors enables nullifying the influence of the threshold voltage Vth on the output voltage of each unit, thereby improving the step-up efficiency and the step-up rate of the circuit.

Figure 5:
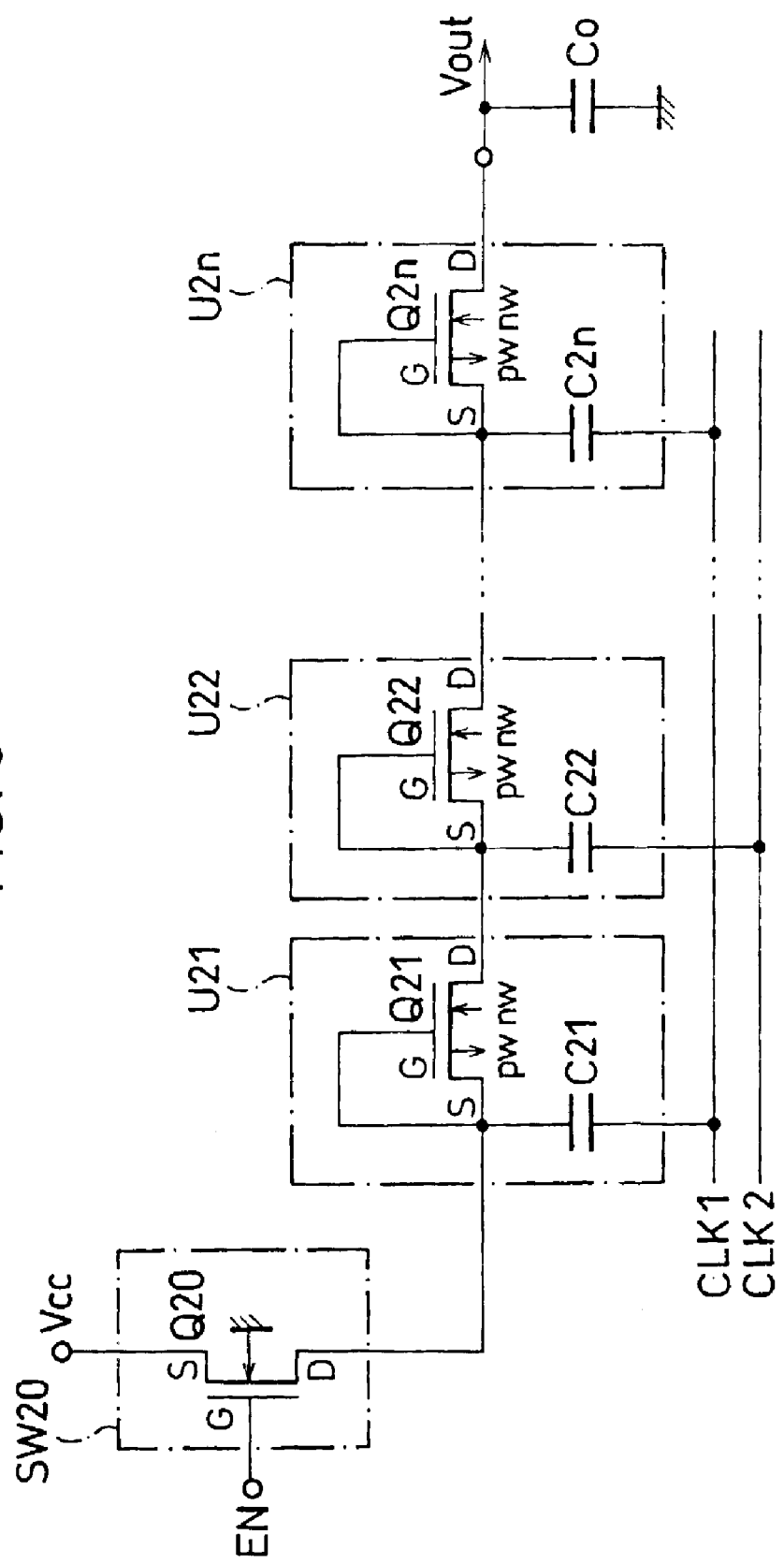
FIG. 5 is a circuit diagram of a second embodiment of a step-up circuit utilizing well separation type NMOS transistors, driven by a two-phase clock.

Referring to FIG. 5, there is shown a second embodiment of a step-up circuit driven by a two-phase clock according to the invention.

It is seen in FIG. 5 that the step-up circuit comprises N-stage series charge pump units, with a first stage having unit U21 and an output stage having unit U2n.

The supply voltage Vcc is supplied to the first stage unit U21 via a power switch SW20. The switch SW20 is similar to the switch SW10 of the first embodiment described above, and can be an ordinary NMOS transistor Q20.

The stepped-up voltage Vout, i.e. the voltage output from the output stage unit U2n, is the voltage of the fully charged output capacitor Co connected to the unit U2n.

The units U21–U2n are all the same in structure that only the unit U21 will be described in detail below. The unit U21 comprises a well separation type NMOS transistor Q21 and a capacitor C21. The well separation type NMOS transistor Q21 and the capacitor C21 correspond to the conventional NMOS transistor Q1 and the capacitor C1, respectively, of FIG. 1.

That is, in the second embodiment shown herein, well separation type NMOS transistors Q21–Q2n described earlier in connection with FIG. 3 are used as the NMOS transistors of the respective units U21–U2n. The supply voltage Vcc is sequentially stepped-up by the respective units U21–U2n to the output voltage Vout.

In the step-up operations, the source S of NMOS transistor goes HIGH. The potential of the corresponding P-type well Pwell is determined by the potential of the source S, independently of the potential of the P-type substrate Psub. Hence, the threshold voltage Vth will not be affected by the source potential if the source potential goes HIGH, due to the substrate bias effect. As a result, the threshold voltage Vth remains LOW in all of the units, allowing for the same step-up voltage in the respective units.

Figure 1:
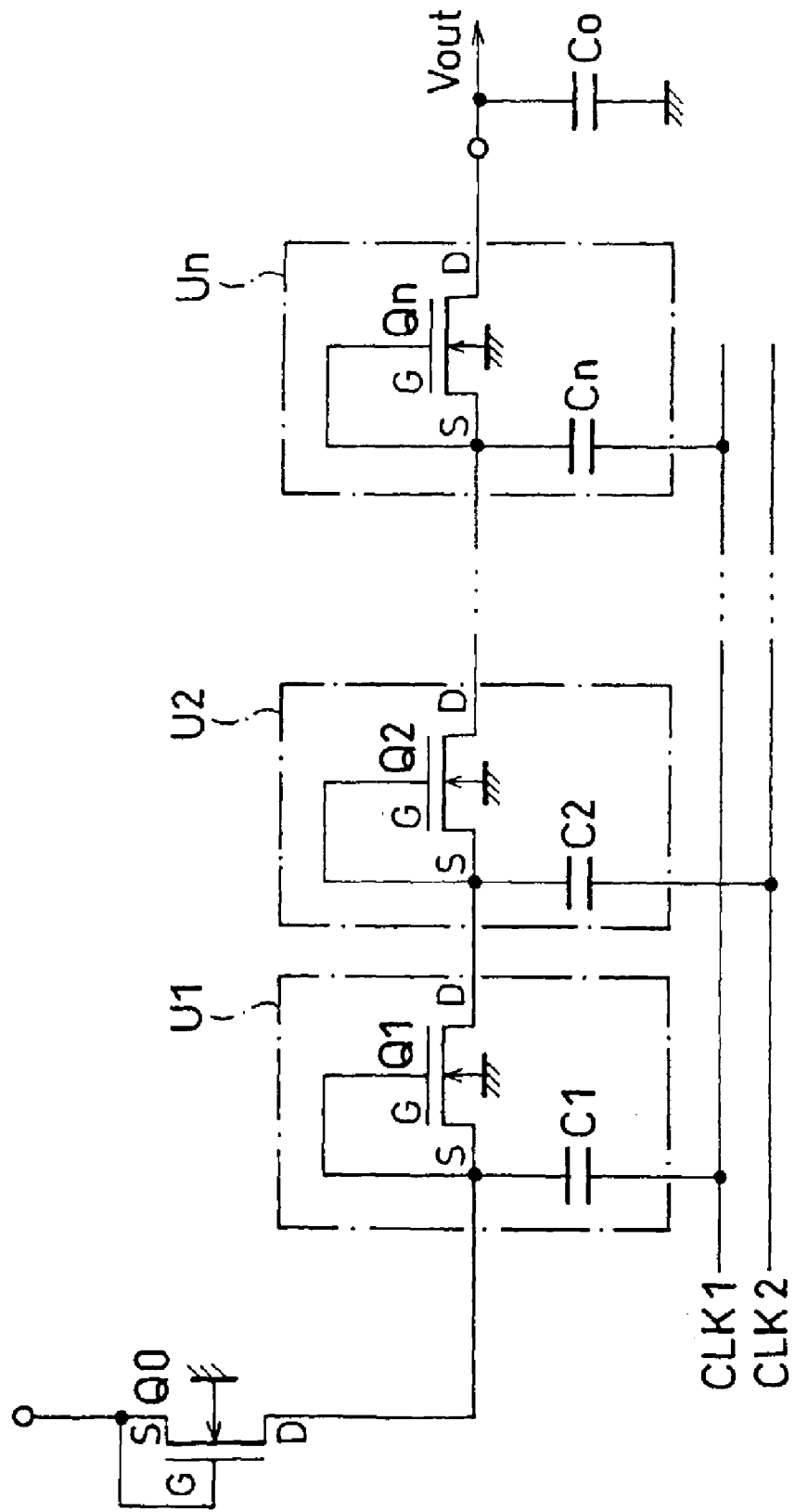
FIG. 1 is a block diagram of a conventional step-up circuit.

In the second embodiment shown, the threshold voltage Vth of the NMOS transistor of any unit remains LOW. Therefore, the problem pertinent to conventional step-up circuits that the step-up voltage per unit decreases towards the final output stage is solved by the invention. A supply voltage can be thus stepped up to a preferred output voltage by a minimum number of units. For example, in a case where the supply voltage Vcc of 3 Volts is stepped up to the output voltage Vout of 10 Volts, only 4 stages or units will be necessary in accordance with the second embodiment of the invention as shown in FIG. 5, as compared with 8 units being necessary in the conventional step-up circuit as shown in FIG. 1. It is noted that under the same conditions the same step-up voltage can be obtained with a faster step-up rate by a 3-stage step-up circuit in accordance with the first embodiment as shown in FIG. 2.

Although examples have been described in the first and the second embodiments where a positive supply voltage Vcc is stepped up to a positive high output voltage Vout, the same step-up circuit can be used to negatively step up a supply voltage to obtain a negative high output voltage, as follows.

To do this the output terminal of the step-up circuit providing the output voltage Vout as shown in FIGS. 2 and 5 is grounded. The clocks CLK1–CLK4 are varied between the ground potential and a positive potential Vcc for example. This permits generation of a negative high potential (i.e. large potential of negative polarity) on one end of the first stage unit U11 (or U21) proximal to the switch SW10 (or SW20), in accord with the number of stages (units) The function and the merit of this embodiment are the same as those of the first and the second embodiments described above.

Referring to FIGS. 6–9, there is shown a third embodiment of a semiconductor device equipped with a step-up circuit of the invention.

Figure 6:
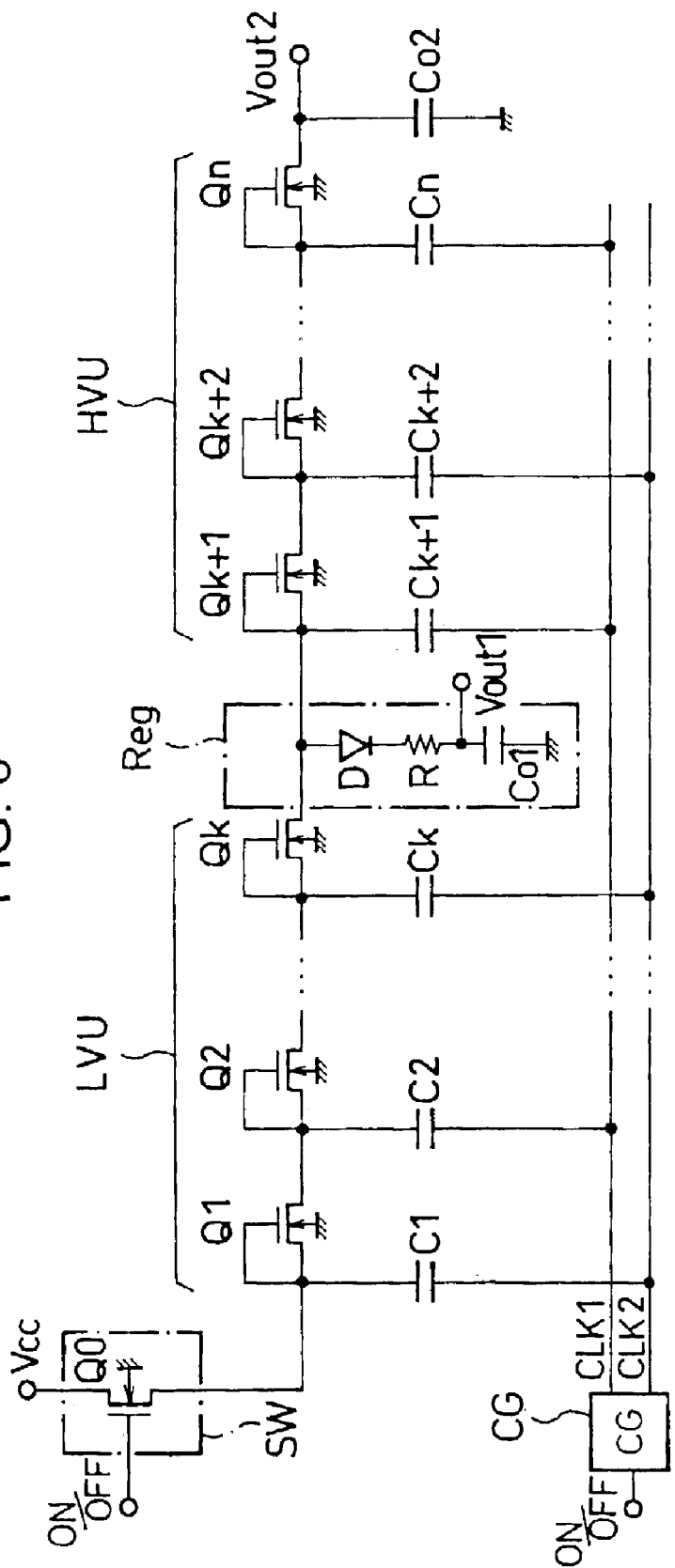
FIG. 6 is a circuit diagram of a step-up circuit of a third semiconductor device of the invention.
Figure 7:
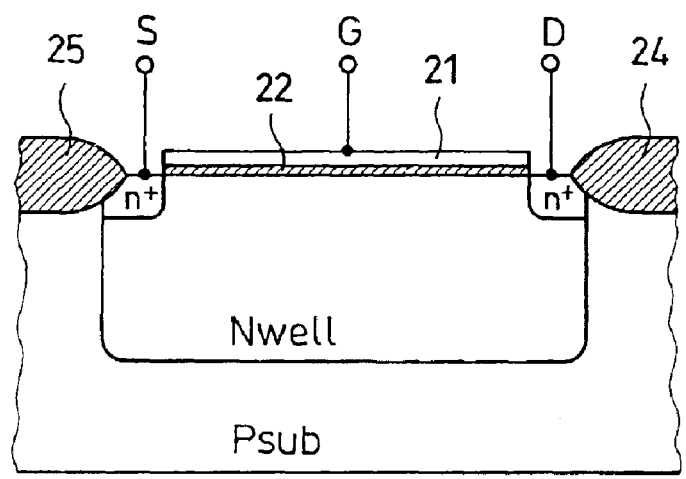
FIGS. 7(a) and (b) are schematic diagrams of a MOS capacitor of a low-voltage charge pump unit.
Figure 7:
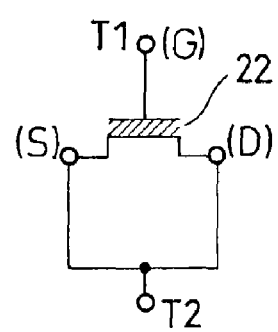
Figure 8:
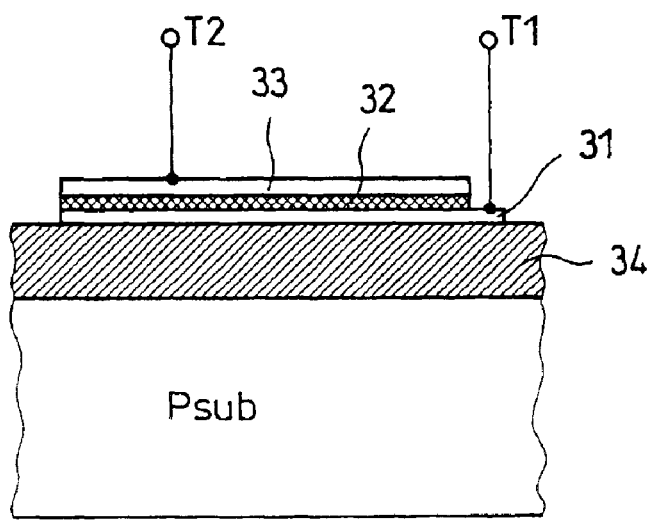
FIGS. 8(a) and (b) are schematic diagrams of a floating type capacitor for use in a high-voltage charge pump unit.
Figure 8:
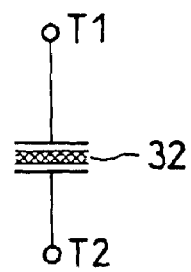
Figure 9:
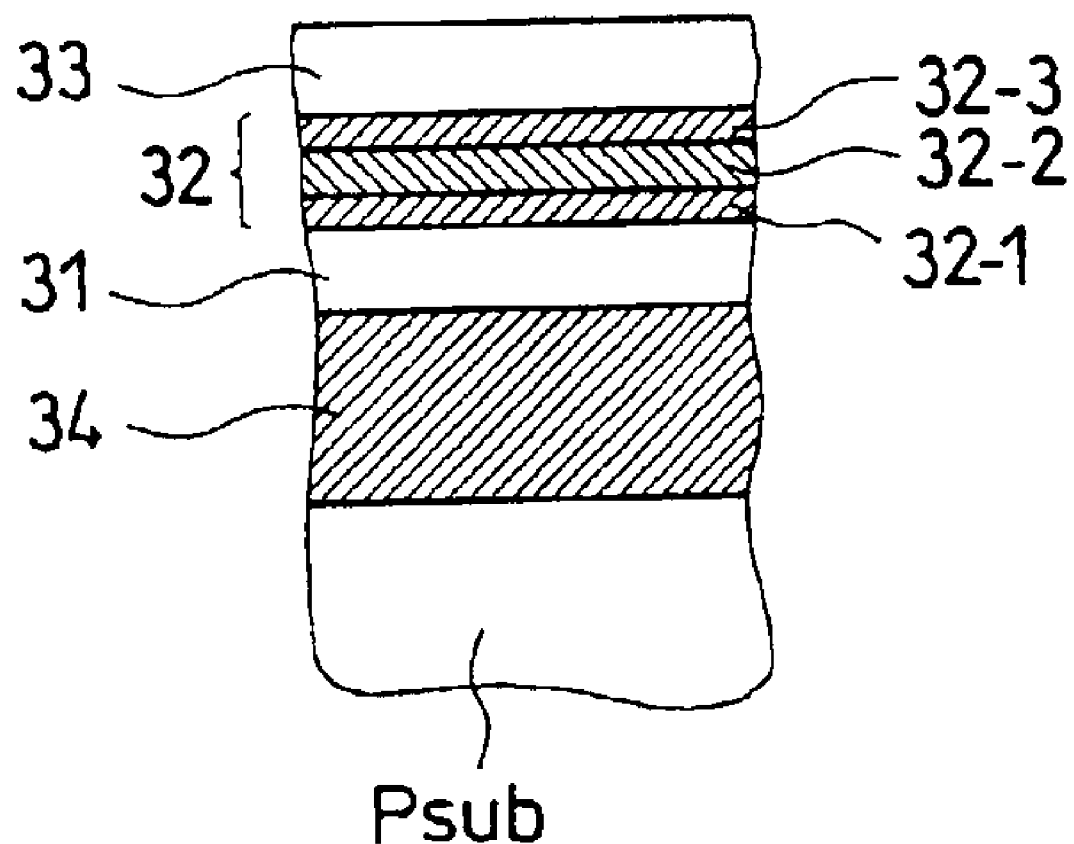
FIG. 9 is a schematic diagram showing a portion of the capacitor of FIG. 8(a).

FIG. 6 shows a structure of a step-up circuit for use in a third embodiment of a semiconductor device of the invention. FIGS. 7–9 are schematic views of MOS capacitors for use in a charge pump unit of FIG. 6.

As seen in FIG. 6, each of the charge pump units consists of an NMOS transistor and a capacitor. The first stage unit consists of a transistor NMOS transistor Q1 and a capacitor C1; the second stage unit consists of a transistor Q2 and a capacitor C2; and so on. The last stage unit consists of a transistor Qn and a capacitor Cn.

Looking at the first stage unit, the source S of the NMOS transistor Q1 is connected to the gate G thereof to form a diode connection, to which a supply voltage Vcc is supplied. The substrate is connected to the lowest potential available, that is, the ground potential. The drain D is connected to the source S of the transistor Q2 of the unit in the next stage. One end of the capacitor C1 is connected to the source S of the NMOS transistor Q1, while the other end connected to the clock line (which is the clock line of a first clock CLK1 in the example shown).

Similarly, the other end of the capacitor C1–Cn of each odd numbered unit is connected to the clock line of the first clock CLK1. On the other hand, the other end of the capacitor of each even numbered unit is connected to the clock line of a second clock CLK2.

The total number of units or stages is determined by the supply voltage Vcc (which is, for example, 3V) and the second output voltage Vout2 (which is 12V for example).

A switch SW includes an NMOS transistor Q0, and is adapted to control the step-up circuit in response to an operational ON/OFF signal.

The first k stages starting from the first unit of the NMOS transistor Q1 and capacitor C1 to the kth unit of a transistor Qk and a capacitor Ck constitute a group of low-voltage units LVU (referred to as low-voltage group), while remaining units starting from the (k+1)st unit of a transistor Q(k+1) and a capacitor C (k+1) to the terminal unit of a transistor Qn and a capacitor Cn constitute a high voltage group HVU.

The low-voltage group LVU is provided at the output end thereof with a regulator Reg for outputting a predetermined first output voltage Vout1. The first output voltage Vout1, which is 6 V for example, is higher than the supply voltage Vcc but lower than a predetermined second output voltage Vout2 that is provided by the high-voltage group. The first output voltage may be arbitrarily determined in accordance with a specification of a device, such as a flash memory, requiring multiple voltages. The regulator Reg consists of a backflow prevention diode D, a current limiting resistor R, and a smoothing capacitor Co1, all connected in series as shown in FIG. 6.

A clock generation circuit CG is provided to control the clocks CLK1 and CLK2 in response to the operational ON/OFF signal, The first and second clocks CLK1 and CLK2, respectively, together form a two-phase clock varying in substantially opposite phase having a predetermined frequency and a predetermined voltage amplitude which equals, for example, the supply voltage Vcc.

In the step-up circuit of FIG. 6, as the switch SW is turned ON in response to an operational signal ON, the clock generation circuit CG starts its oscillation, and the first and the second clocks CLK1 and CLK2, respectively, starts clocking in opposite phase.

Each of the units starts charge pumping operation simultaneously in response to the first and the second clocks CLK1 and CLK2, respectively, thereby sequentially charging the respective units with the supply voltage Vcc. As a result, the first output voltage Vout1 and the second output voltage Vout2 are generated. These output voltages Vout1 and Vout2 are supplied to a flash memory for example.

FIG. 7 schematically shows a MOS capacitor for use as capacitors C1–Ck of the low-voltage group LVU of FIG. 6. FIG. 7($a$) shows a cross section, and FIG. 7($b$), electric connection.

As shown in FIG. 7($a$), an N-type well Nwell is formed in a P-type substrate Psub. Highly concentrated N-type n+ regions corresponding to a source region and a drain region of the MOS transistor are formed in the N-type well Nwell. A gate insulation layer 22 is formed to cover the N-type well Nwell. The gate insulation layer 22 is a layer of dioxide silicon (hereinafter referred to as dioxide layer or $SiO_2$ layer) having a thickness sufficient to withstand a low voltage (at least the first output voltage Vout1).

A conductive layer 21 is formed on the gate insulation layer 22 between the high concentration n+ regions to serve as a first charging electrode. The first charging electrode is connected to a terminal G. The conductive layer 21 is a layer of poly-silicon polySi formed by doping an N-type or P-type semiconductor with an impurity.

The high concentration n+ regions are connected to terminals S and D via respective contacts to serve as second charging electrodes. In addition, dioxide layers 24 and 25, called LOCOS, are formed as shown.

This MOS transistor works as a capacitor having a first charging electrode T1 (which is the terminal G) and a second charging terminal T2 (which is the electrodes S and D connected together), as shown in FIG. 7($b$). The terminal T1 is connected to the sources of the respective transistors Q1–Qk of the low-voltage group LVU. The terminal T2 is connected to the clock line of either the first clock CLK1 or the second clock CLK2.

Since the gate insulation layer 22 of the MOS capacitor is a thin oxide layer rendered to withstand a low voltage (at least the first output voltage Vout1), electrostatic capacity per unit area is sufficiently large. As a result, it can be used as an appropriate capacitor for the low-voltage group LVU. It is noted that the capacitor can be formed simultaneously with the gate oxide layer of other MOS transistors of the low-voltage circuit.

FIGS. 8($a$) and ($b$) respectively show schematically a cross section and electric connections of the high-voltage group capacitors Ck+1–Cn. These capacitors Ck+1–Cn must have a structure to withstand a high voltage. However, if they are formed by MOS capacitors like conventional ones, the gate insulation layers (or oxide layers) must be sufficiently thick. Hence, in order to obtain necessary capacitance, a large area must be disadvantageously expended for the capacitors. Instead, in the present invention, the MOS capacitors of high-voltage group are configured different in structure than the low-voltage group MOS capacitors in order to minimize capacitor areas.

To do this, a first poly-silicon layer 31 is formed on an oxide layer 34 which is formed on the P-type substrate Psub, as shown in FIG. 8($a$). A further dielectric layer 32 having a high dielectric constant is formed on the first poly-silicon layer 31 and a second poly-silicon layer 33 is formed on the dielectric layer 32. The first poly-silicon layer 31 serves as a first charging electrode, while the second poly-silicon layer 33 serves as a second charging electrode. The first and second charging electrodes are connected to terminals T1 and T2, respectively, as shown in FIG. 8($b$).

The oxide layer 34 is an insulation layer for electrically insulating the first poly-silicon layer 31 from the P-type substrate Psub. The oxide layer 34 can be used as a LOCOS, that is an oxide layer for separating elements. In that case, LOCOS for separating other elements, e.g. LOCOSes 24 and 25 for the MOS capacitor of FIG. 7, can be used as the LOCOS_ of the capacitor of FIG. 8(a). In this specification capacitors as shown in FIG. 8 are referred to as floating type capacitors.

As seen in FIG. 8, the dielectric layer 32 and the second poly-silicon layer 33 are formed so as to expose one end (which is the right end in the example shown) of the first poly-silicon layer 31. The end is connected to the first terminal T1. The second poly-silicon layer 33 is connected at the center thereof to the first terminal T2. The terminals T1 and T2 can be connected together in any other way. For example, the opposite ends of the first poly-silicon layer 31 can be exposed for connection with the first terminal T1 when the dielectric layer 32 and the second poly-silicon layer 33 are formed. The second poly-silicon layer 33 is connected at the center thereof to the first terminal T2. Such arrangement facilitates reduction of a parasitic resistance of the capacitor, thereby improving electric characteristics of the capacitor.

A material having a larger dielectric constant than $SiO_2$ and necessary to withstand voltage is selected for the dielectric layer 32. In view of the above mentioned requirements on the dielectric constant and withstand voltage, a preferred material is chosen for the capacitors, having a larger electrostatic capacitance per unit area than the MOS capacitors C1–Ck of the units in the low-voltage group LVU. For example, a nitride, $Ta_2O_5$ (oxide tantal), and $TiO_2$ (oxide titanium) are appropriate candidates.

FIG. 9 shows a schematic partial cross section of an exemplary dielectric layer of FIG. 8.

As shown in FIG. 9, an oxide layer 32-1 is formed on the first poly-silicon layer 31. The oxide layer 32-1 is covered with an nitride layer (or nitrided oxide layer) 32-2 formed by nitriding the surface of the oxide layer 32-1 with NH3 (ammonia) and further covered with an oxide layer 32-3. Then a second poly-silicon layer 33 is formed on the oxide layer 32-3. In this way, the dielectric layer 32 is formed to be a three-ply dielectric layer that includes a nitride layer 32-2 between the oxide layers 32-1 and 32-3. The three-ply layer will be referred to as ONO layer.

Using the ONO layer as the dielectric layer 32, a floating type capacitor having a large withstand voltage and a large capacitance can be easily manufactured.

Further, the floating type capacitor as depicted in FIGS. 8 and 9 has the first and second charging electrodes in the form of a first and a second poly-silicon layers 31 and 33, respectively, having a smaller resistance than the diffusion layer. Consequently, the resistance of the capacitor is reduced accordingly. This implies that the time constant of charging is shortened and less energy loss is involved in the charging.

As described above, the first and second conductive layers (first and second electrodes) of such floating type capacitor are poly-silicon layers (polySi) formed by doping N-type or P-type semiconductors, respectively, with impurities. Since these poly-silicon layers have smaller resistances as compared with the diffusion layer, it is possible to reduce internal parasitic resistance of the capacitor. The internal parasitic resistance of the capacitor may be further reduced by forming the first and second conductive layers (first and second electrodes) by aluminum.

The dielectric layer of the floating-type capacitor is a three-ply layer composed of a nitride layer sandwiched by two oxide layers. This three-ply layer is structurally stable and has a large dielectric constant.

In addition, by including a regulator consisting of a smoothing capacitor and a reverse current prevention diode within a series of multiple charge pump units, in the same manner as shown in FIG. 6, a prescribed intermediate voltage can be provided for use along with the final output voltage. Thus, the step-up circuit is useful for devices such as a flash memory which requires multiple voltages.

Referring to FIGS. 10–15, there are shown a fourth, a fifth, and a sixth embodiments of a semiconductor devices equipped with a step-up circuit of the invention.

Figure 10:
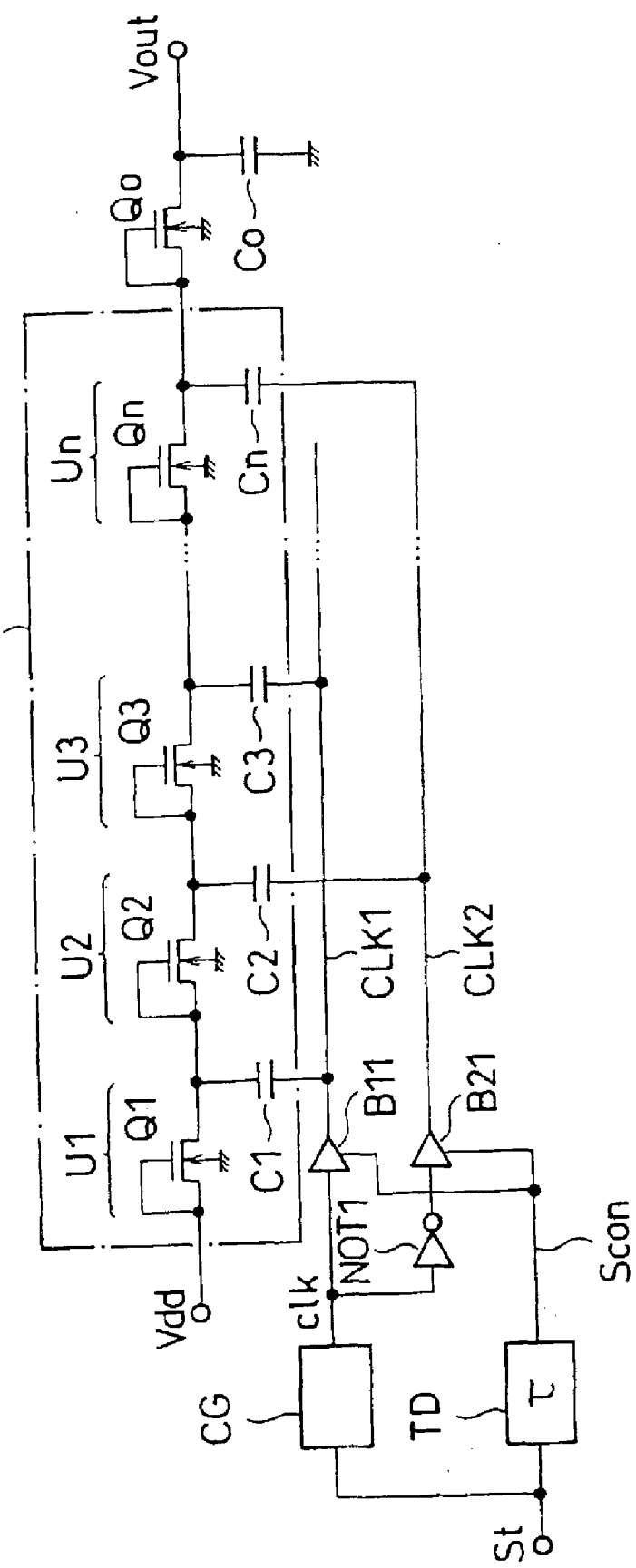
FIG. 10 is a circuit diagram of a step-up circuit of a fourth semiconductor device of the invention.
Figure 11:
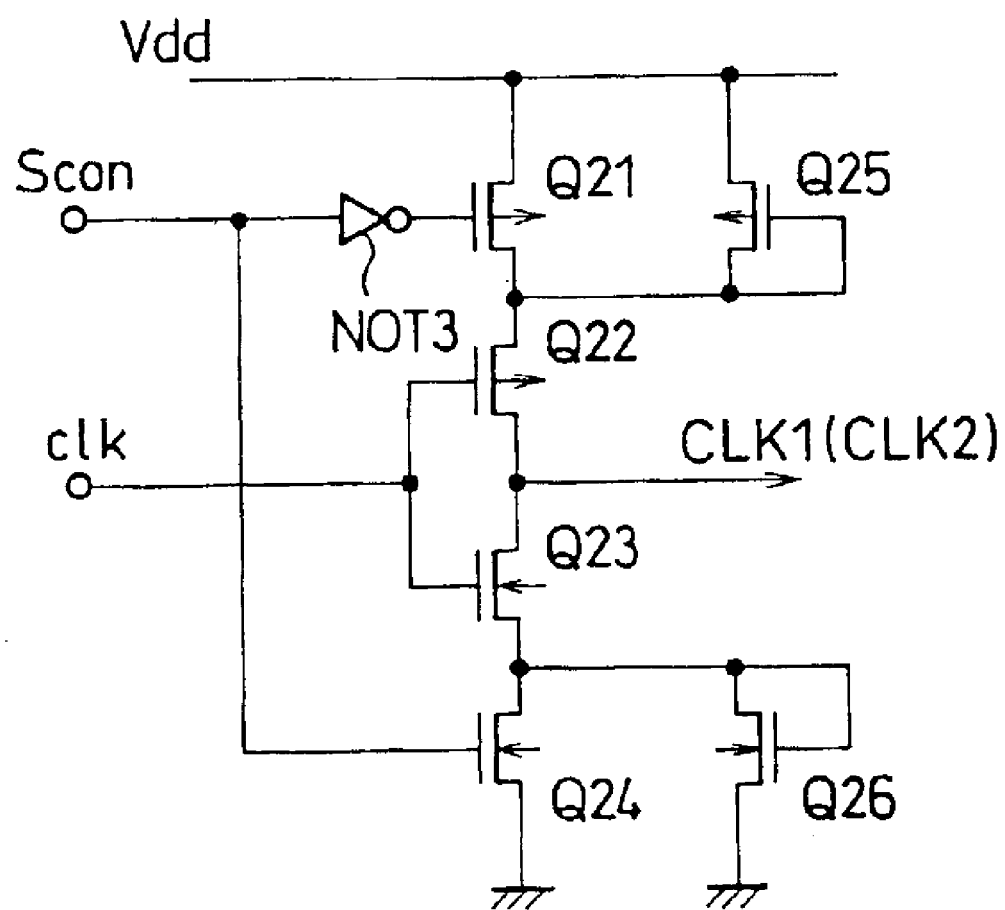
FIG. 11 is circuit diagram of a buffer for generating a clock.
Figure 12:
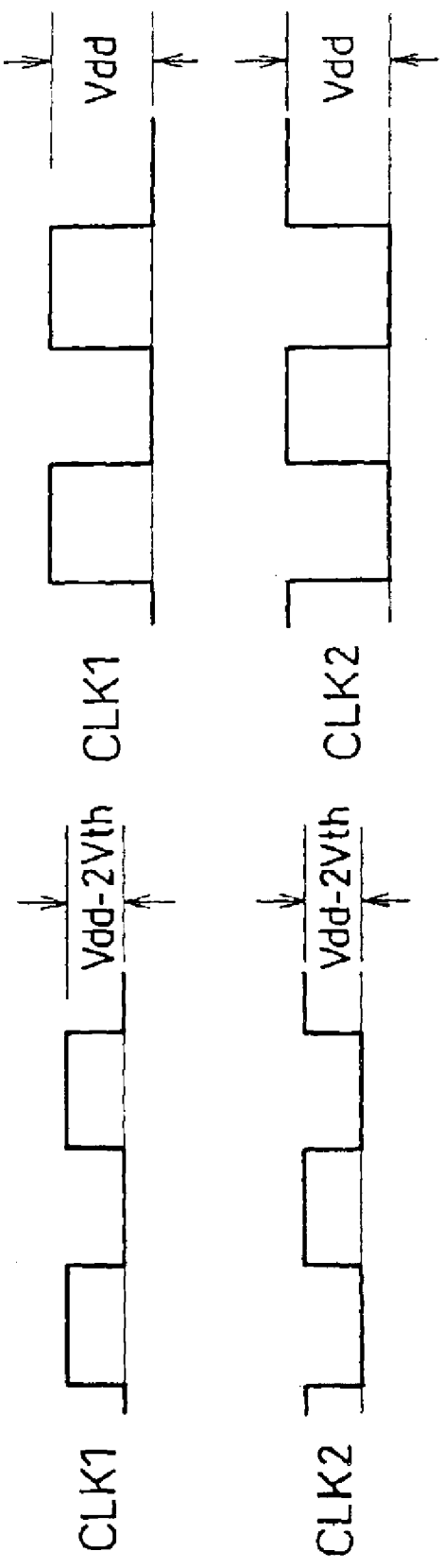
FIGS. 12(a) and (b) compare a clock having a limited current supply capability and an ordinary clock.

FIG. 10 illustrates the fourth embodiment of the invention. FIG. 11 illustrates a buffer for generating a clock. FIG. 12 compares a clock having limited current supplying capability (referred to as limited clock) with an ordinary clock.

As shown in FIG. 10, N-stage charge pump units (referred to as unit), starting from a first charge pump unit U1 to a final charge pump unit Un (output stage), all connected in series, constitute a high-current pump CP1. A supply voltage Vdd (e.g. 2V or 3V) is supplied to the first stage unit U1. A prescribed output Vout (e.g. 10 V) is provided from the output stage unit Un via a smoothing circuit that consists of an NMOS transistor Qo and a capacitor Co.

All the units U1–Un are of the same structure that only the first unit U1 will be described below. The unit U1 comprises an NMOS transistor Q1 and a capacitor C1. The source S of the NMOS transistor Q1, connected to the gate G thereof to form a diode connection. The supply voltage Vdd is supplied to the source S. The drain D is connected to the source S of the NMOS transistor Q2 of the next stage unit. The substrate of the NMOS transistor Q1 is connected to the lowest potential of the circuit, which is in this example the ground potential. The capacitor C1 has one end connected to the drain D and another end connected to a clock line (which is in this example the clock line of the first clock CLK1).

The capacitors of odd numbered units U1, U3, etc. are connected to the first clock CLK1, while the capacitors of even numbered units U2, U4, etc. are connected to the clock line of the second clock CLK2.

The first clock CLK1 and second clock line CLK2 have a prescribed frequency and a prescribed voltage amplitude, which can be the same as for example the frequency and the amplitude of the supply voltage. The two clocks vary in opposite phase to form a two-phase clock. The first clock CLK1 results from a clock clk amplified by a first buffer B11. The second clock CLK2 results from the clock clk inverted by an inverter circuit NOT1 and amplified by a second buffer B21.

In the step-up circuit shown in FIG. 10, upon receipt of a startup signal St (not shown), the clock clk begins to alternate between a HIGH and a LOW level, which is converted by the first buffer B11, inverter circuit NOT1, and the second buffer B21 to the first and second clock CLK1 and CLK2, respectively, varying in opposite phase. The smoothing circuit consisting of the NMOS transistor Qo and a capacitor Co may be included in the high-current pump CP1.

In the fourth embodiment shown in FIG. 10, the step-up circuit includes a clock generation circuit which comprises: a clock generation circuit CG outputting a clock clk upon receipt of a startup signal St; an on-delay timer TD adapted to pull up a startup time control signal Scon from the LOW level to the HIGH level a prescribed time τ after the receipt of the startup signal St; an inverter circuit NOT1 for inverting the clock clk; a controllable first buffer B11 operable in synchronism with the clock clk, the driving power of the buffer being controlled by the startup time control signal Scon; and a second controllable buffer B21 operable in synchronism with the inverted clock, the driving power of the buffer B21 being controlled by the startup time control signal Scon.

FIG. 11 is a schematic circuit diagram of the controllable first buffer B11 (and of the controllable second buffer B21) of the fourth embodiment. As shown in FIG. 11, a PMOS transistor Q21, a PMOS transistor Q22, NMOS transistors Q23 and Q24 are connected in series in the order mentioned between the supply voltage Vdd and the ground potential.

The gate of the well separation type NMOS transistor Q21 is supplied with the startup time control signal Scon via an inverter circuit NOT3. The gate of the NMOS transistors Q24 is directly supplied with the startup time control signal Scon. The well separation type NMOS transistor Q21 is connected in parallel to a diode-connected PMOS transistor Q25. The NMOS transistors Q24 is connected in parallel with a diode-connected NMOS transistor Q26.

The gates of the MOS transistors Q22 and Q23 are supplied with a clock clk (or an inverted version of the clock clk). The first clock CLK1 (or the second clock CLK2) is outputted from the node of the MOS transistors Q22 and Q23.

Referring to FIGS. 10–12, operations of the step-up circuit will now be described.

As the startup signal St goes HIGH, the clock generation circuit CG promptly starts its oscillation to generate the clock clk. At the same time the timer TD starts counting a predetermined time τ. The clock clk is supplied to the controllable first buffer B11 directly, and to the B21 via the inverter circuit NOT1. As a consequence, a two-phase clock consisting of the first clock CLK1 and the second clock CLK2 having a prescribed frequency but varying in opposite phase is generated from the controllable first buffer B11 and second buffer B21.

Since the startup time control signal Scon remains LOW until the predetermined time τ elapses after the rise of the startup signal St, the well separation type NMOS transistor Q21 and Q24 are turned OFF during the time. Consequently, the first clock CLK1 and the second clock CLK2 are outputted via the diode-connected MOS transistors Q25 and Q26 during the period of time τ.

The MOS transistors Q25 and Q26 undergo a voltage drop by a threshold voltage Vth. Therefore, the voltage amplitudes (i.e. the difference between the HIGH and LOW levels) of the first clock CLK1 and second clock CLK2 are reduced to Vdd-2Vth, as shown in FIG. 12(a). The power consumption by the high-current pump CP1 increases with the capacitance of the unit U1–Un, and with the amplitude of the input signal at the opposite end (that is, the end connected to the clock lines). It is noted that in the invention the first clock CLK1 and the second clock CLK2 has a reduced amplitude so that the power consumption by the high-current pump CP1 is reduced accordingly.

As a consequence of the first clock CLK1 and second clock line CLK2 being reduced in amplitude, capabilities of the clocks supplying current to the capacitors of the respective units U1–Un (referred to as the current supplying capabilities of the clocks) are limited. This suppresses power consumption by the step-up circuit. As compared with a conventional large power consumption by a startup current (typically 100 mA) immediately after an onset of a step-up circuit, the power consumption by an inventive startup current is greatly reduced (typically the current reduced as low as 40 mA).

Thus, although it takes a little more time for the inventive step-up circuit to generate an intended output voltage Vout1, power consumption is greatly suppressed during a startup, thereby minimizing changes in supply voltage and hence avoiding adverse influences on other devices.

After the predetermined period of time τ after the startup, the startup time control signal Scon goes HIGH, rendering the well separation type NMOS transistors Q21 and Q24 turned ON, which removes the voltage drops across the MOS transistors Q25 and Q26. Hence, the first clock CLK1 and second clock CLK2 respectively undergo the same voltage change as the supply voltage Vdd, as shown in FIG. 12(b). Under this normal condition, the current needed by the step-up circuit is in the range of 10–20 mA, though it depends on the load connected. This current is much smaller than the current needed during a startup, so that its change has much less adverse influences on other devices.

Figure 13:
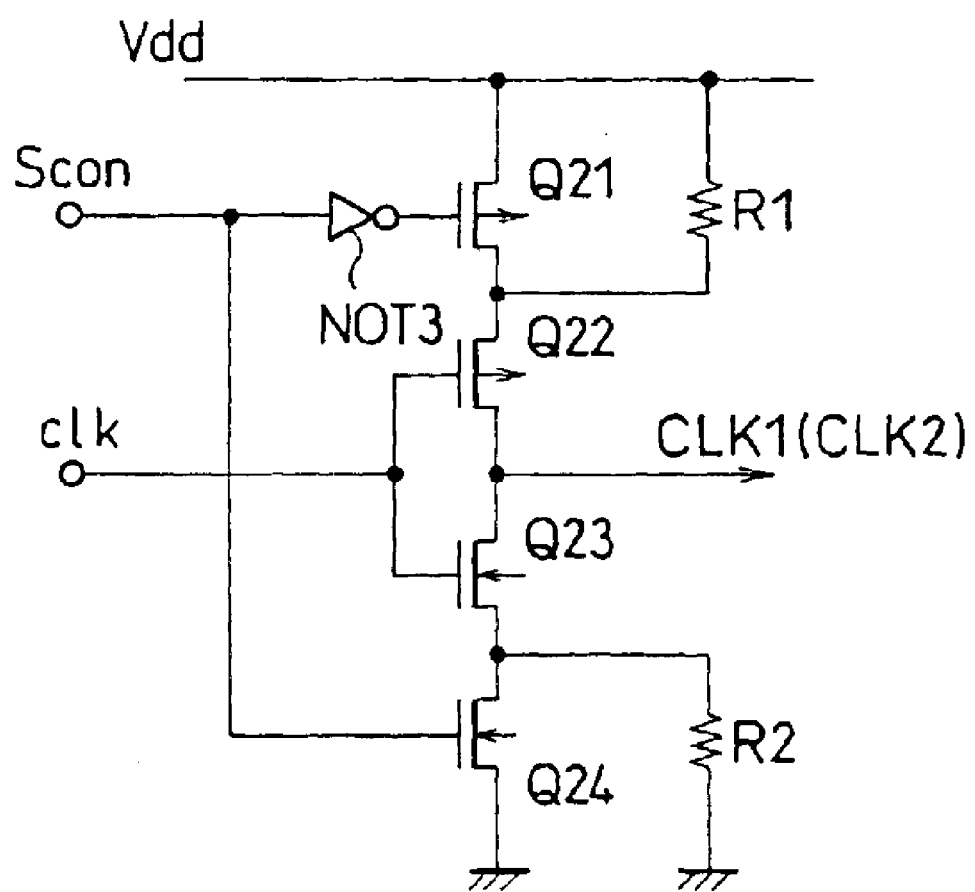
FIG. 13 is a circuit diagram of a buffer alternative to the one shown in FIG. 11.

FIG. 13 shows an alternative of the controllable first buffer B11 and second buffer B21. In this example, resistors R1 and R2 are used in place of the diode-connected MOS transistors Q25 and Q26 serving as elements providing a constant voltage drop.

The resistors R1 and R2 serve as current limiting elements. Thus, the controllable first buffer B11 and second buffer B21 of FIG. 13 can provide current limiting functionality at the time of startup. It will be apparent that the resistors R1 and R2 may be replaced by a constant current generator to obtain the same result. These alternative resistors and a constant current generator can be applied to other embodiments.

Figure 14:
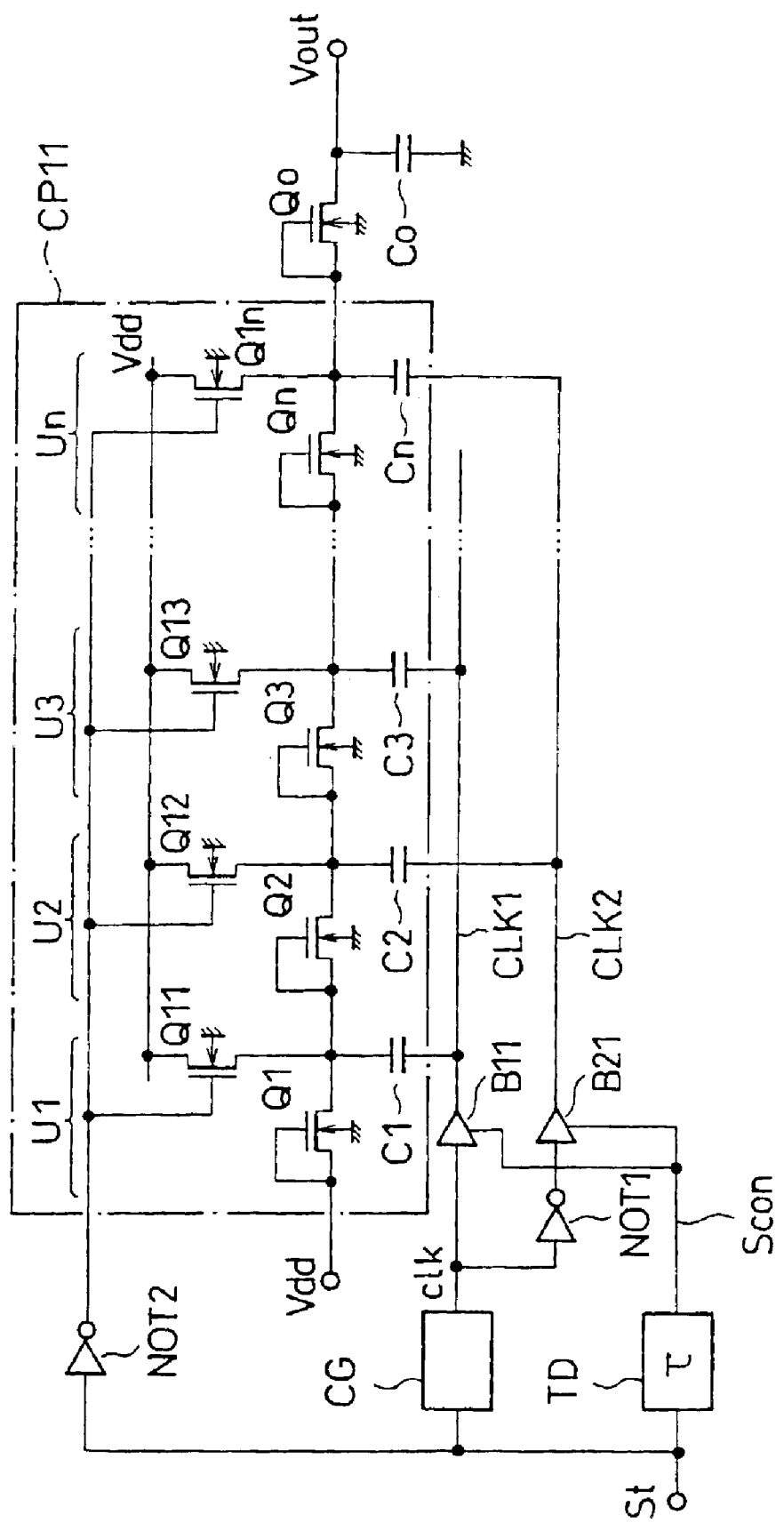
FIG. 14 is a circuit diagram of a step-up circuit of a fifth semiconductor device of the invention.

FIG. 14 shows a step-up circuit of a fifth semiconductor device according to the invention.

In the fifth embodiment shown in FIG. 14, there is provided clamp means for clamping the output voltage supplied from one unit to another of the units U1–Un of the high-current pump CP1 to the maximum possible voltage, that is, the supply voltage Vdd.

The clamp means consist of MOS transistors Q11–Q1n (which are NMOS transistors in the example shown), each connected between the output end of a respective unit U1–Un and the supply voltage Vdd. The NMOS transistors Q11–Q1n are turned ON and OFF by the control signal obtained by inverting the startup signal St by the inverter circuit NOT2. The fifth embodiment has the same structure as the fourth embodiment of FIG. 10 except for the clamp means.

Referring to FIG. 14, when the step-up circuit is halted, the NMOS transistors Q11–Q1n are turned ON. Hence, all the output voltages of the respective units U1–Un, that is, the voltages of the respective capacitors C1–Cn are clamped to the supply voltage Vdd.

As the startup signal St goes HIGH, the voltage is inverted to LOW by the inverter circuit NOT2, so that the NMOS transistors Q11–Q1n are turned OFF, thereby unclamping the capacitors C1–Cn from the supply voltage Vdd.

Subsequently, the step-up circuits step up the supply voltage in the same way as in the fourth embodiment shown in FIG. 10. However, due to the fact that the capacitors have been clamped to the supply voltage Vdd, only a little current will do in charging respective capacitors. Hence, the step-up circuit requires much less current during a startup as compared with the fourth embodiment. It will be appreciated that, given a startup current, the time for limiting the current supplying capability can be decreased in the fifth embodiment, as in the fourth embodiment.

It is noted that when the step-up circuit is halted, one of the controllable first buffer B11 and the second buffer B21 of FIG. 14 is HIGH and the other is LOW depending on the condition of the clock generation circuit CG. However, by adding a simple logic circuit that is controlled by the startup signal St to the controllable first buffer B11 and second buffer B21, it is possible to fix the output of these transistors at the LOW level. In the third case, all of the capacitors C1–Cn can be charged to the supply voltage Vdd.

Figure 15:
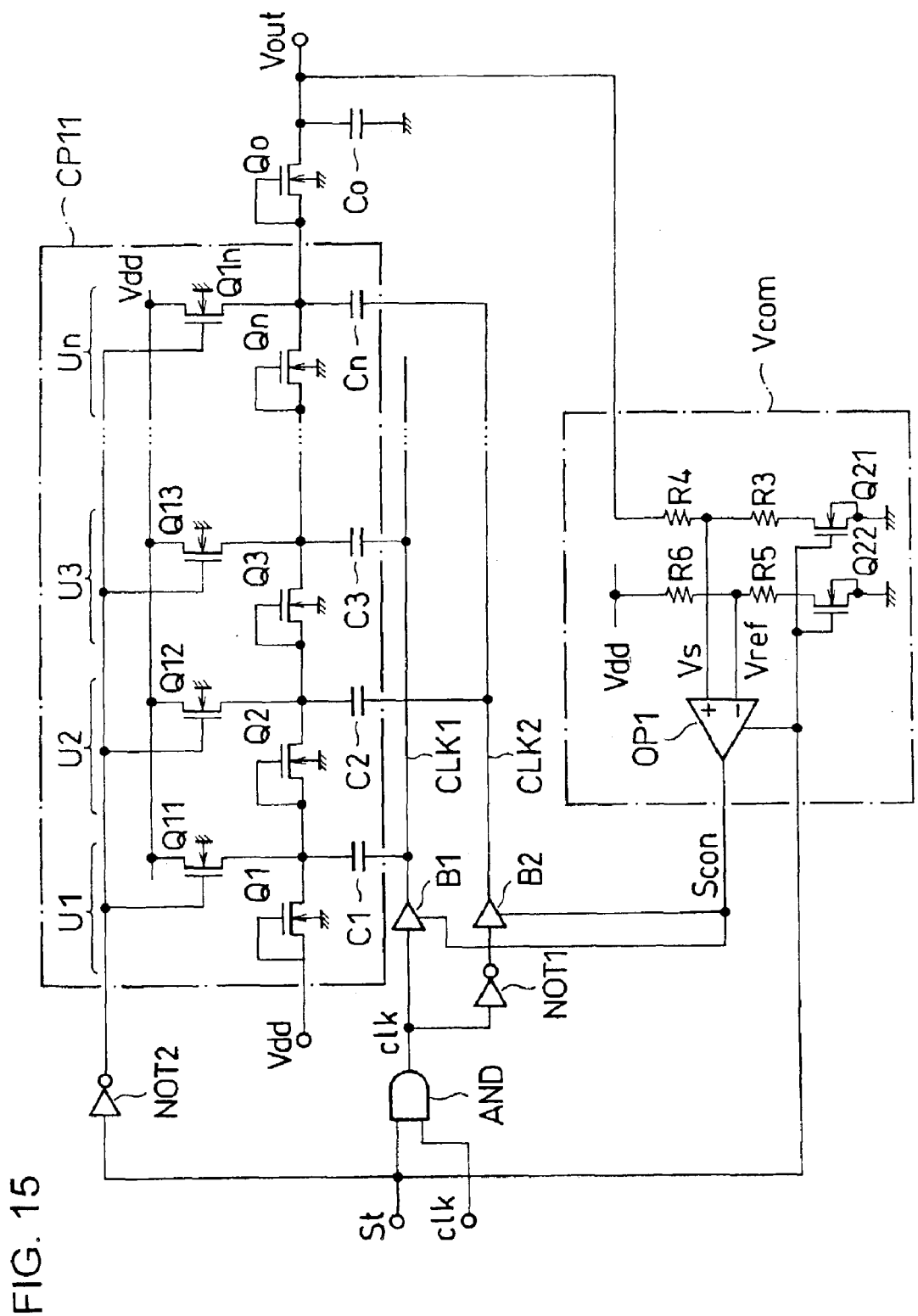
FIG. 15 is a circuit diagram of a step-up circuit of a sixth semiconductor device of the invention.

FIG. 15 shows a sixth embodiment of a semiconductor device equipped with a step-up circuit.

In this sixth embodiment, there is provided means Vcom for comparing the output voltage Vout of the step-up circuit with a reference voltage (said means referred to as voltage comparison means) when generating a startup-time control signal Scon. When compared with the fourth and the fifth embodiments, the timers TD of these embodiments are "removed" in the sixth embodiment.

The clock generation circuit CG of the fourth and fifth embodiments are now replaced by an AND circuit AND. This circuit performs AND operation on the startup signal St and an externally supplied clock clk to output the clock clk. The sixth embodiment has the same structure as the fifth embodiment except for the AND circuit.

The voltage comparison means Vcom comprise: a first voltage dividing means for dividing the output voltage Vout by resistors R3 and R4 to generate a comparison voltage Vs(=Vout×R3/(R3+R4)); a second voltage dividing means for dividing the supply voltage Vdd by resistors R5 and R6 to generate a reference voltage Vref(=Vdd×R5/(R5+R6)); an operational amplifier OP1 for comparing the comparison voltage Vs with the reference voltage Vref to output a startup-time control signal Scon when Vs>Vref; and NMOS transistors Q21 and Q22 connected between the resistor R3 and the ground and between the resistor R5 and the ground, respectively. The voltage comparison means Vcom causes the NMOS transistors Q21 and Q22 to be turned ON upon the rise of the startup signal St to enable the operational amplifier OP1. This arrangement facilitates suppression of wasteful power consumption during a standby.

In the arrangement of FIG. 15, as a startup signal St goes HIGH, the MOS transistors Q11–Q1n are turned OFF to terminate clamping the output voltages of the units. At the same time, the first and second clock CLK1 and CLK2 are generated from an externally supplied clock clk supplied via the AND circuit AND, which initiates the charge pumping operations of the circuit.

Under this condition, the startup time control signal Scon is LOW, and hence the amplitudes of the first clock CLK1 and second clock CLK2 are small, thereby limiting the current supply capability of the respective capacitors of the units U1–Un, and hence suppressing the power consumption by the step-up circuit in just the same way as in the fourth embodiment.

The output voltage Vout rises with time after the startup. As the comparison voltage Vs, generated from the output voltage Vout, becomes larger than the reference voltage Vref generated from the supply voltage Vdd (Vs>Vref), the output of the operational amplifier OP1, or the startup time control signal Scon, goes HIGH.

This causes the current supplying limitation of the controllable first buffer B11 and the second buffer B21 to be removed, allowing the first clock CLK1 and the second clock CLK2 to restore the normal amplitude of the supply voltage Vdd.

In this manner, the current supplying capability of the controllable first buffer B11 and the second buffer B21 is limited until the output voltage Vout of the step-up circuit reaches the predetermined level after the startup, and the limitation is removed thereafter to restore the normal step-up condition. Thus, although it takes a little more time to reach the intended output voltage Vout, power consumption during a startup of the step-up circuit is effectively suppressed to minimize changes of the output voltage and resultant adverse influences on other devices.

In the above embodiments, although the limitation on the current supply capability of the clock has been introduced only to the first stage, it can be applied to more than one stages as needed.

It will be apparent to a person skilled in the art that the charge pump unit is not limited to the ones described above, and can be modified within the scope of the invention. For example, the above described MOS transistor can be replaced by a double-well separation type MOS transistor which has an N-type well formed on a P-type substrate, a P-type well formed in the N-type well, an N-type source region formed in the P-type well, an N-type drain region formed away from the source region and separated by a channel region, and a gate formed above the channel region via an insulation layer, wherein the N-type well is coupled with a high potential such that the N-type well is doubly impressed by reverse biases between the N-type well and the P-type substrate and between the N-type well and the P-type well. As another example, each of the units can have a main NMOS transistor, a main capacitor, an auxiliary NMOS transistor and an auxiliary capacitor which are driven by a four-phase clock. As another example, the capacitor of the third embodiment may be utilized as a respective capacitor of the first and the second embodiments. Further, any of the buffer circuits of the fourth through the sixth embodiments can be used as the buffer circuit in the first through the third embodiments. With these design modifications, a more compact, energy-saving step-up circuit may be obtained.

What we claim is:

1. A semiconductor device equipped with a voltage step-up circuit, said semiconductor device comprising a switch for supplying a power supply voltage to said voltage step-up circuit after being turned on by an enable signal, and said voltage step-up circuit comprising multiple charge pump units connected in series, each charge pump unit consisting of a MOS transistor and a capacitor having one end connected to the input or output end of said MOS transistor and another end connected to a clock line supplying a clock, said multiple charge pump units adapted to step up a supply voltage in response to said clock, wherein said MOS transistor is a well separation type MOS transistor having
 a second-conduction type well formed in a first-conduction type substrate;
 a first-conduction type well formed in said second-conduction type well;
 a second-conduction type source region formed in said first-conduction type well;
 a second-conduction type drain region formed away from said source region and separated by a channel region; and
 a gate formed above, and separated by an insulation layer from, said channel region, wherein said second-conduction type well is connected to a high potential so that opposite biases are established between said second-conduction type well and said first-conductive type substrate and between said second-conduction type well and said first-conduction type well, wherein said well separation type MOS transistor consists of a main well separation type MOS transistor and a well separation type auxiliary MOS transistor;

said capacitor consists of a main capacitor and an auxiliary capacitor;

the drain of said main well separation type MOS transistor is connected to the gate of said well separation type auxiliary MOS transistor;

the gate of said main well separation type MOS transistor is connected to the drain of said well separation type auxiliary MOS transistor;

the source of said main well separation type MOS transistor is connected to the source of said well separation type auxiliary MOS transistor;

said main capacitor is connected between said source of said main well separation type MOS transistor and a four-phase clock line; and said auxiliary capacitor is connected between said gate of said main well separation type MOS transistor and said four-phase clock line.

2. The semiconductor device equipped with a step-up circuit according to claim 1, wherein said four-phase clock line consists of a first clock line for supplying a first clock, a second clock line for supplying a second clock which is located near the center of said first clock on the time axis and has a narrower width than said first clock, a third clock line supplying a third clock which is substantially in opposite phase with respect to said first clock, and a fourth clock line for supplying a fourth clock which is located near the center of said third clock on the time axis and has a narrower width than said third clock, wherein said first through fourth clocks time-sequentially repeat timing periods i-viii, wherein only a third clock has high level and other clocks have low levels in period i, third and first clocks have high levels and other clocks have low levels in period ii, only a first clock has high level and other clocks have low levels in period iii, first and second clocks have high levels and other clocks have low levels in period iv, only a third clock has high level and other clocks have low levels in period v, first and third clocks have high levels and other clocks have low levels in period vi, only a third clock has high level and other clocks have low levels in period vii, and third and fourth clocks have high levels and other clocks have low levels in period ii; and said main capacitors of odd numbered charge pump units are connected to said first clock line;

said auxiliary capacitors of odd numbered charge pump units are connected to said second clock line;

said main capacitors of even numbered charge pump units are connected to said third clock line; and said auxiliary capacitors of even numbered charge pump units are connected to said fourth clock line.

* * * * *